United States Patent [19]

Narikiyo et al.

[11] Patent Number: 6,152,506

[45] Date of Patent: *Nov. 28, 2000

[54] NOZZLE BLOCK OF ELECTRONIC PART SUCTION HOLDING NOZZLE

[75] Inventors: Kazuhiko Narikiyo; Shoichiro Sato, both of Kofu; Takao Kashiwazaki; Noboru Ikenoue, both of Yamanashi-ken, all of Japan

[73] Assignee: Matsushita Electric Industrial Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/897,451

[22] Filed: Jul. 22, 1997

[51] Int. Cl.[7] ............................................. B25J 15/06
[52] U.S. Cl. .............................. 294/64.1; 29/743
[58] Field of Search ............................ 294/64.1, 65, 902; 29/740, 743; 239/601; 269/21; 279/3; 901/40

[56] References Cited

U.S. PATENT DOCUMENTS 2,390,298  12/1945  Glassner ................................. 294/64.1
3,147,017   9/1964  Dunham ............................... 294/64.1 X
4,559,718  12/1985  Tadokoro ............................. 294/64.1 X
4,767,142   8/1988  Takahashi et al. .
4,875,279  10/1989  Sakiadis .............................. 294/64.1 X

FOREIGN PATENT DOCUMENTS 209739  8/1989  Japan .................................... 294/64.1

*Primary Examiner*—Johnny D. Cherry
*Attorney, Agent, or Firm*—Parkhurst & Wendel, L.L.P.

[57] ABSTRACT

A nozzle rod (1) is formed by fixing a thick diamond chip (2) to a tip of a nozzle pipe (4) made of a super hard metal, the other end of the nozzle pipe (4) is thinned and the nozzle rod (1) is joined with a shank (5) by way of this end, a tip of the nozzle rod (1) and vicinities thereof are so shaped as to have a predetermined sectional shape, a center hole is formed in the diamond chip (2) by wire electrospark machining and expanded for forming a nozzle slot (10) having a nozzle opening (11) consisting of a center slit (12) and "U-shaped" slits (13, 14) which are disposed symmetrically on both sides of a longitudinal direction of the center slit (12), thereby composing an electronic part adsorbing nozzle (7). This construction enables it to provide an electronic part adsorbing nozzle (7) which is economical and excellent in durability.

4 Claims, 3 Drawing Sheets

NOZZLE BLOCK OF ELECTRONIC PART SUCTION HOLDING NOZZLE

FIELD OF THE INVENTION

The present invention relates to an electronic part adsorbing nozzle to be used for electronic part mounting machines and a manufacturing method thereof.

BACKGROUND OF THE INVENTION

Electronic part mounting machines use electronic part adsorbing or suction holding nozzles for adsorbing required electronic parts and mounting them at predetermined locations on circuit boards.

Used as a known electronic part adsorbing nozzle is a nozzle made of a super hard metal, in which a tip thereof has a nozzle opening formed in a predetermined shape and an adsorbing surface coated with diamond for imparting abrasion resistance and a magnetization-preventive function.

The nozzle opening mentioned above consists, for example, of a center slit and "V-shaped" slits extending from the middle of the center slit symmetrically rightward and leftward, and formed symmetrical with regard to a vertical center axis and a horizontal center axis respectively of the adsorbing surface. Owing to this shape, the nozzle opening is configured so as to have adsorbing portions for exerting an adsorbing force to an electronic part and supporting portions for receiving the electronic part, which portions are distributed alternately and uniformly so that the nozzle can cope with variations in size and deviations in locations of electronic parts.

However, the known electronic part adsorbing nozzle having the configuration described above poses problems which are described below:

The known electronic part adsorbing nozzle is often threatened to be defective, and inevitably requires a high manufacturing cost due to low yield since the coating material often protrudes into the nozzle opening at a stage to coat the adsorbing surface of the tip with diamond.

Further, the known adsorbing nozzle poses a problem from a viewpoint of compressive resistance since the nozzle opening is composed of the radially formed "V-shaped" slits, the supporting portions naturally have acute angles in an adsorbing condition and tips of the portions having the acute angles are liable to be broken. This problem will be described more concretely. When an electronic part which has an area smaller than a half of the nozzle opening is adsorbed, an adsorbing force is exerted to the electronic part only within a central region of the nozzle opening, the adsorbing force exerting to the electronic part is received by the supporting portions having the acute angles and a stronger compressive force is loaded on the supporting portions having the acute angles at a stage to mount the electronic part onto a circuit board, whereby the supporting portions having the acute angles located at the tip of the nozzle are liable to be broken.

Furthermore, the known electronic part adsorbing nozzle poses another problem that it is obliged to be disposed of when its tip becomes defective since the nozzle is formed as an integral part ranging from its tip having the diamond coating to a mounting shank (grip) and the nozzle cannot be repaired simply by replacing the nozzle tip with a new one when it is broken.

DISCLOSURE OF THE INVENTION

It is therefore a primary object of the present invention to provide an electronic part adsorbing or suction holding nozzle which is economical and excellent in durability in production and use by solving the problems described above.

For accomplishing this object, the electronic part adsorbing nozzle according to the present invention is configured to be characterized in that it has a nozzle opening of a nozzle slot, which consists of a center slit and "U-shaped" slits which are formed on both sides of a longitudinal direction of the center slit so as to open outward and symmetrical with each other.

By configuring an electronic part adsorbing nozzle as described above, it is possible to make portions for supporting an electronic part free from acute angles without lowering adsorbing stability for the electronic part and obtain an electronic part adsorbing nozzle excellent in compressive resistance since the nozzle opening formed in the nozzle slot consists of the center slit and the "U-shaped" slits formed on both sides of the longitudinal direction of the center slit, and adsorbing portions for exerting an adsorbing force to the electronic part and supporting portions for receiving the adsorbed electronic part are distributedly disposed. Further, this configuration permits enhancing workability since it makes an adsorbing port free from portions having acute angles and minute portions having acute angles in particular.

Furthermore, a manufacturing method of an electronic part adsorbing nozzle according to the present invention is characterized in that it comprises a first step to form a nozzle rod by fixing a diamond chip to a tip of a nozzle pipe, a second step to form a joint portion for a shank by thinning the other end of the nozzle rod on a side of the nozzle pipe to a predetermined size, a third step to join the nozzle rod with the shank, a fourth step to shape a tip of the nozzle rod and vicinities thereof so as to have a predetermined section, a fifth step to form a center hole in the diamond chip and a sixth step to form a nozzle slot by expanding the center hole in the vicinities of the tip of the nozzle into a predetermined shape.

The manufacturing method described above permits manufacturing a nozzle of any required kind simply and at a high yield by cutting, together with a diamond chip, a tip and vicinities of a nozzle rod which is formed by fixing a diamond chip to a tip of a nozzle pipe so as to have a predetermined sectional shape, and forming a nozzle slot having a predetermined shape.

DESCRIPTION OF THE EMBODIMENTS

Now, embodiments of the electronic part adsorbing or suction holding nozzle and manufacturing method thereof according to the present invention will be described with reference to FIGS. 1, 2 and 3a through 3f.

Figure 1:
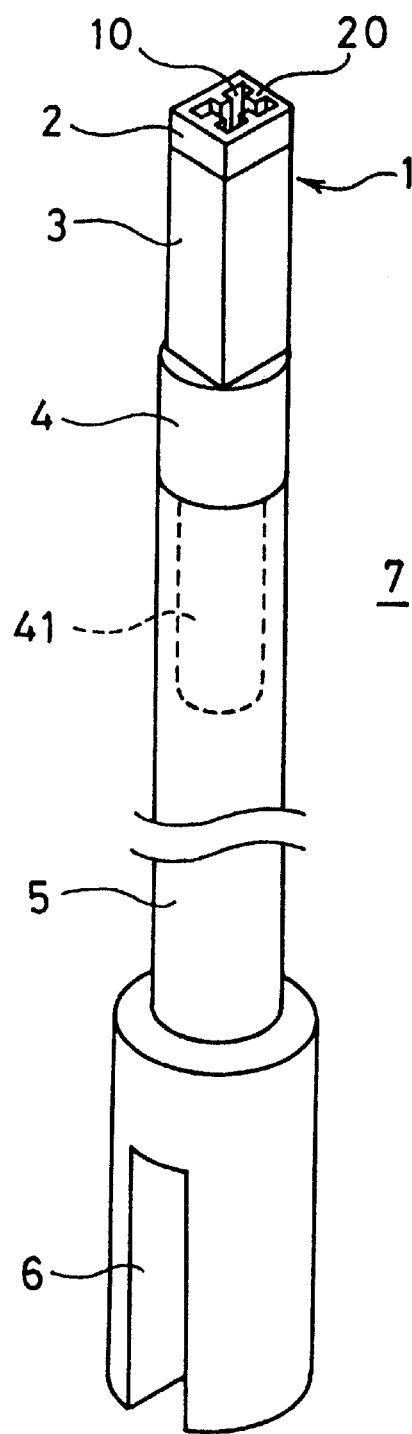
FIG. 1 is a structural diagram illustrating an embodiment of the electronic part adsorbing nozzle according to the present invention.

In FIG. 1, a reference numeral 1 represents a nozzle rod which is used for composing a tip of an electronic part adsorbing nozzle 7, formed by fixing a diamond chip 2 about 2 mm thick to a tip of a nozzle pipe 4 made of a super hard metal, and comprises a nozzle block 3 formed by squareshaping a tip of the nozzle rod 1 together with the diamond tip 2 so as to have a sectional shape and dimensions adaptable to a nozzle adsorbing port. A lower portion of the nozzle rod 1 is thinned to so as to have a predetermined diameter to form a joint portion 41 which is used for fixing the nozzle rod 1 to the shank 5. Further, a mounting section 6 for mounting the nozzle 7 onto an electronic part mounting head (not shown) is formed in advance at the other end (the lower end in the drawings) of the shank 5.

Furthermore, a nozzle opening 11 of a nozzle slot 10 is formed in the vicinity of a tip of the nozzle block 3. The nozzle opening 11 is open in a rectangular nozzle adsorbing surface as shown in FIG. 2, and has a shape which is symmetrical with regard to center lines X and Y respectively of the adsorbing surface 20, and symmetrical around a nozzle axis A.

The nozzle opening 11 consists of a center slit 12 which is rather slender, and "U-shaped" slits 13 and 14 which are open outward on both sides of a longitudinal direction of the center slit 12 and disposed symmetrically with respect to the center lines X and Y respectively. On the other hand, supporting portions of the adsorbing surface 20 for receiving an adsorbed electronic part consist of supporting legs 21, 22, 23 and 24 which protrude toward the nozzle axis A, are formed in nearly rectangular shapes, and have nearly equal widths, length and areas with no acute angles. Outward portions of the nozzle opening 11 have substantially rounded corners.

In the configuration described above, the supporting portions for receiving the electronic part and the adsorbing portions for exerting an adsorbing force to a surface of the electronic part are distributedly disposed alternately and nearly uniformly in both directions along the X and Y axes. In the direction along the Y axis, for example, the supporting and adsorbing portions are disposed alternately and substantially uniformly in the order of the supporting leg 23, the adsorbing portion 12 and the supporting leg 24 in the middle section, and in the order of an outer frame supporting portion, an adsorbing portion 131, the supporting leg 21, an adsorbing portion 132 and an outer frame supporting portion in a section on the left side of the middle section. Supporting portions 133, 134 and adsorbing portions are disposed similarly also in a section on the right side of the middle section and in the direction along the X axis.

Figure 2:
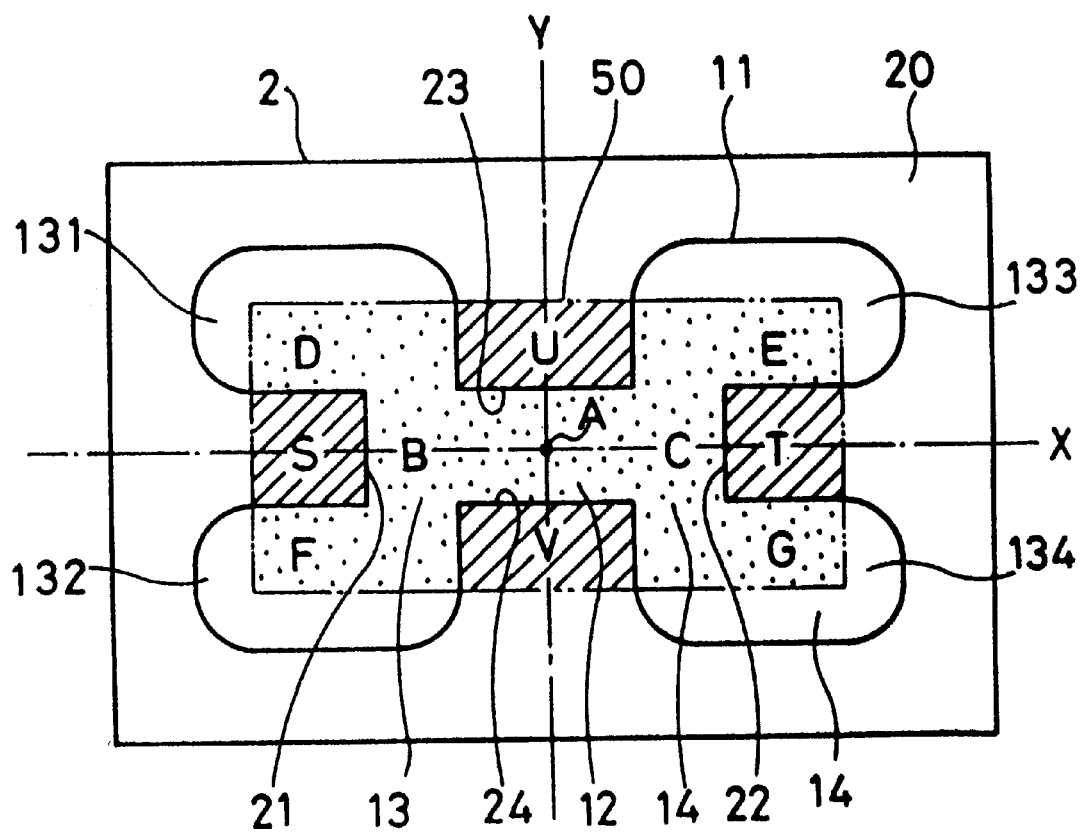
FIG. 2 is a plan view illustrating a nozzle opening of the electronic part adsorbing nozzle shown in FIG. 1.
Figure 3A:
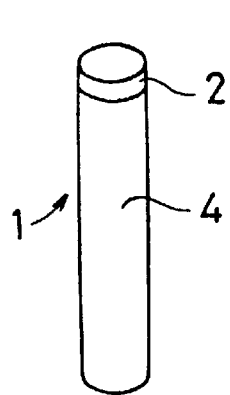
FIGS. 3a through 3f are diagrams sequentially illustrating manufacturing steps for the electronic part adsorbing nozzle shown in FIG. 1.
Figure 3B:
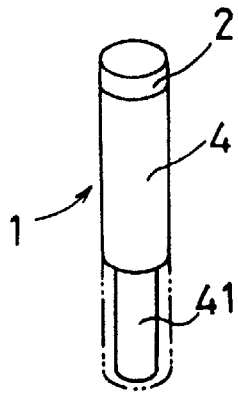
Figure 3C:
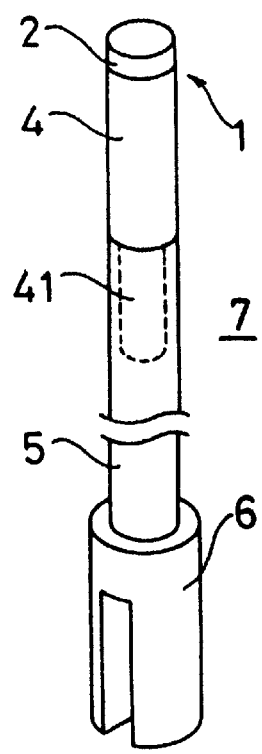
Figure 3D:
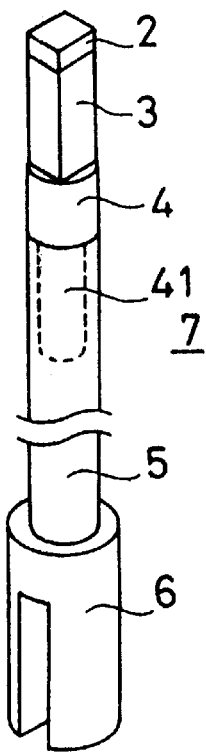
Figure 3E:
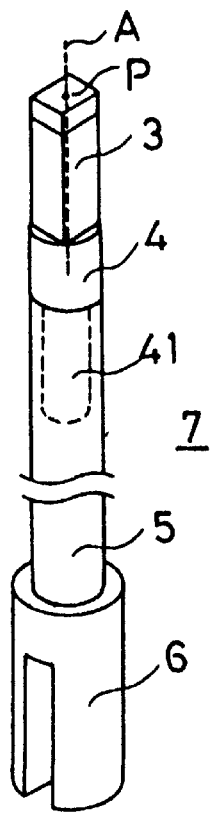
Figure 3F:
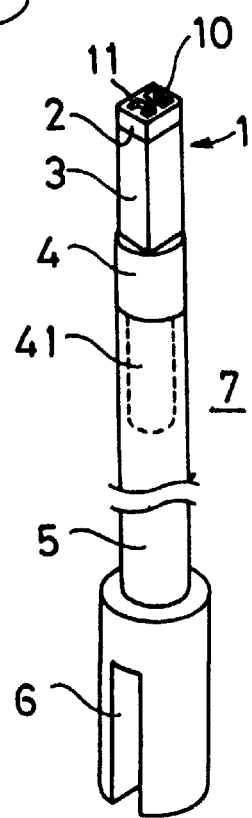

A frame 50 traced in chain lines in FIG. 2 is an example of a minute electronic part adsorbed to the adsorbing surface 20 of the nozzle, and clarifies positional relationship of the adsorbing portions and the supporting portions of the adsorbing surface 20 relative to the electronic part. Dotted areas B, C, D, E, F and G correspond to the adsorbing portions for exerting the adsorbing force to the electronic part, and slashed areas S, T, U and V and the outer frame portions correspond to the supporting portions for receiving the electronic part this positional relationship, or the alternate and substantially uniform distribution of the adsorbing portions and the supporting portions being clearly illustrated in FIG. 2. This relationship between the adsorbing portions and the supporting portions remains substantially unchanged even when an electronic part is slightly smaller than the frame 50 traced in the chain lines, when an electronic part is sufficiently large (for example, as large as an end surface of the nozzle), or when an adsorbing angle is slightly rotated around the nozzle axis.

When a contour of the nozzle opening 11 extrudes from a contour of an electronic part, protruding portions allow suction air to be exhausted. However, the portions which allow the suction air to be exhausted are distributed uniformly at four corners of the electronic part as shown in FIG. 2 (portions left blank outside the frame 50), and serve for adsorbing the electronic part at a normal position and in a normal direction.

Table 1 compares performance of the electronic part adsorbing nozzle according to the present invention (No. 1) with that of the known electronic part adsorbing nozzle (No. 2). As seen from Table 1, the electronic part adsorbing nozzle according to the present invention exhibits such adsorbing performance as is remarkably improved collectively since the adsorbing nozzle 7 is configured so as to have the nozzle opening 11 which consists of the center slit 12, and the "U-shaped" slits 13 and 14 disposed symmetrically on both sides of the longitudinal direction of the center slit 12.

Compressive resistance, for example, is enhanced by the present invention to 153.0 kg, approximately 1.6 times as high as 96.9 kg of the known electronic part adsorbing nozzle. Further, the present invention remarkably enhances abrasion resistance, thereby improving a service life 3 to 10 times as long as that of the known electronic part adsorbing nozzle. In some cases, a single nozzle may be used for adsorbing 10,000,000 parts or so.

Further, the electronic part adsorbing nozzle according to the present invention exerts a sufficient adsorbing force and assures uniform air flow.

Furthermore, the present invention improves performance to adsorb electronic parts in erect positions thereof. The the electronic part adsorbing nozzle according to the present invention is capable of adsorbing electronic parts in normal positions thereof even when they are adsorbed at slightly deviated locations since the portions for adsorbing and supporting electronic parts are disposed alternately and substantially uniformly with no eccentricities on the adsorbing surface 20.

Accordingly, the present invention enhances economical advantages in manufacturing and use of nozzles, and solves the problems of abrasion resistance, compressive resistance, etc., thereby providing the electronic part adsorbing nozzle 7 which is capable of maintaining stable adsorbing performance for a long time and excellent in durability.

Furthermore, the joint portion 41 formed by cutting the other end of the nozzle rod 1 (the nozzle pipe 4) allows the nozzle rod 1 to be coupled with the shank 5 which is common to various kinds of nozzles, thereby making it possible to provide the inexpensive adsorbing nozzle 7 which is compatible with various types of electronic part adsorbing machines. Moreover, the present invention makes it possible to provide the adsorbing nozzle 7 which has excellent abrasion resistance and outstanding compressive resistance since the tip of the nozzle rod 1 is made of the diamond chip 2, and which sufficiently prevents electronic parts from being magnetized, hardly breaks and ensures long durability since the diamond chip 2 is thick.

Should the diamond chip 2 be broken, the nozzle rod 1 can be independently replaced with a new one at a low cost.

Now, the manufacturing method of the electronic part adsorbing nozzle according to the present invention will be described with reference to FIG. 3a through FIG. 3f in a due sequence.

1. First Step (see FIG. 3a)

A nozzle rod 1 is formed by fixing a diamond chip 2 to a tip of the nozzle pipe 4 made of a super hard metal. The diamond chip 2 is prepared, for example, by binding fine diamond grains with a binder into a disk about 2 mm thick.

2. Second Step (see FIG. 3b)

A joint portion 41 for coupling the nozzle rod 1 with a shank 5 is formed by cutting the other end (root) of the nozzle rod 1 to have a predetermined small diameter.

3. Third Step (see FIG. 3c)

The joint portion 41 of the nozzle rod 1 is inserted into a joint hole formed in one end of the shank 5 and butting portions of these parts are joined by welding or the like. Now, the nozzle rod 1 and the shank 5 have been integrally joined with each other, and air flow slots preliminarily formed in the nozzle pipe 4 and the shank 5 have been communicated with each other.

4. Fourth Step (See FIG. 3d)

The tip of the nozzle rod 1 and vicinities thereof are cut into a square to form a nozzle block 3 which has a form, dimensions and a sectional shape adaptable to a nozzle adsorbing port. The nozzle block 3 has a section measuring, for example, approximately 1.2 mm×1.5 mm for minute parts though variable dependently on sizes of electronic parts to be adsorbed. It is desirable to use wire electrospark machining since super hard materials such as diamond and a super hard metal require rather minute machining at this step. This applies also to the following fifth and sixth steps.

The electrospark machining permits machining the super hard metal, diamond and the like with high precision by immersing a tool electrode and a work into an insulating liquid with a very small space therebetween and producing pulse-like arc discharge between the tool electrode and the work under a voltage of around 100 V, so that craters are formed in the work due to melting and vaporization of the electrode and the work as well as an impact pressure produced by the vaporization. The electrospark machining is suited to the machining described above, since it exerts a weak force while machining, produces little influences due to heat, facilitates machining works into complicated forms and can easily be automated. The wire electrospark machining uses a thin metal wire as an electrode and is effective for such minute machining as described above.

5. Fifth Step (see FIG. 3e)

A center hole is formed by the wire electrospark machining in a center of the diamond chip 2 in a direction along the nozzle axis A. Now, a run-through slot p has been formed throughout the nozzle rod 1. When a rod member which has no center hole is used as the super hard metal of the nozzle rod, a center hole can be formed in the rod member itself at this step.

6. Sixth Step (see FIG. 3f)

A nozzle slot 10 having a nozzle opening 11 in a shape shown in FIG. 2 is formed in the diamond chip 2 by the wire electrospark machining. The nozzle slot 10 is communicated with an air flow slot (not shown) preliminarily formed in the shank 5 and serves as a suction air passage for the entire nozzle 1.

Though the sequence of the first through sixth steps described above is partially modifiable, it is preferable, from a viewpoint of maintenance of precision, that the sixth step where the nozzle slot 10 is formed comes the last as a final step, and it is desirable, from a viewpoint of production efficiency, that the steps which use the wire electrospark machining come one after another successively.

The manufacturing method described above eliminates the necessity to coat the nozzle tip with diamond in manufacturing an electronic part adsorbing nozzle, thereby facilitating a manufacture of the nozzle, shortening a manufacturing time, enhancing yield, and consequently reducing a manufacturing cost by 30 to 40% approximately.

Though the diamond chip 2 is used additionally, it can be formed easily and with high precision by the wire electrospark welding.

As understood from the foregoing description, the present invention makes it possible to solve the problems of the known electronic part adsorbing nozzle, such as a high production cost and low compressive resistance of edge portions, thereby enhancing economical advantage in production and use of the adsorbing nozzle 7.

TABLE 1

| No. | | 1 | 2 |
|---|---|---|---|
| Nozzle Shape | | 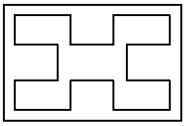 | 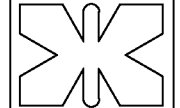 |
| ① | Adsorbing Area (mm²) | 0.55 | 0.55 |
| ② | Adsorbing Force (g) | 4.15 | 4.15 |
| ③ | Compressive Resistance (kg) | 153.0 | 96.9 |
| ④ | Abrasion Resistance of Edge Portion | ○ | x |
| ⑤ | Performance for Adsorbing Part in Erect Position | ○ | ◎ |
| ⑥ | Air Flow | Uniform | Uniform |
| ⑦ | Nozzle Choking | ○ | ○ |
| ⑧ | Workability Evaluation | Δ ◎ | x Δ |

What is claimed is:

1. An electronic part suction holding nozzle, said nozzle having a nozzle opening comprising a generally vertically extending center slit and "U-shaped" slits symmetrically located at both ends of said center slit and opening outwardly in generally opposite directions, wherein said nozzle opening extends in a plane generally transverse to said vertically extending center slit.

2. An electronic part suction holding nozzle according to claim 1, wherein said nozzle comprises a nozzle rod having a tip in which said nozzle opening is formed and a shank in which a mounting portion for an electronic mounting head is formed, and wherein said nozzle rod and said shank are replaceably joined.

3. An electronic part suction holding nozzle according to claim 2, wherein said nozzle tip comprises a diamond chip.

4. An electronic part suction holding nozzle according to claim 1, wherein each "U-shaped" slit comprises a base slit and two side slits connected at opposite ends of said base slit at right angles to said base slit, both ends of said center slit are connected to the center of each base slit at right angles, and said base slits oppose each other.

* * * * *